(12) United States Patent
Gaynes et al.

(10) Patent No.: US 11,224,927 B2
(45) Date of Patent: Jan. 18, 2022

(54) CIRCUIT CARD ATTACHMENT FOR ENHANCED ROBUSTNESS OF THERMAL PERFORMANCE

(71) Applicant: International Business Machines Corporation, Armonk, NY (US)

(72) Inventors: Michael Gaynes, Vestal, NY (US); Edward J Yarmchuk, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 705 days.

(21) Appl. No.: 14/951,770

(22) Filed: Nov. 25, 2015

(65) Prior Publication Data

US 2017/0148758 A1 May 25, 2017

(51) Int. Cl.
*B23K 1/00* (2006.01)
*H05K 3/34* (2006.01)
(Continued)

(52) U.S. Cl.
CPC ............ *B23K 1/0016* (2013.01); *B23K 1/008* (2013.01); *H05K 3/3494* (2013.01); *B23K 2101/42* (2018.08); *H01L 24/13* (2013.01); *H01L 24/16* (2013.01); *H01L 24/29* (2013.01); *H01L 24/32* (2013.01); *H01L 2224/131* (2013.01); *H01L 2224/16227* (2013.01);
(Continued)

(58) Field of Classification Search
CPC ................ H01L 24/75; H01L 23/3675; H01L 23/49822; H01L 23/49838; H01L 23/49855; H01L 24/17; H01L 24/81; H01L 2224/16245; H01L 2224/75272; H01L 2224/75501; H01L 2224/7565; H01L 2224/75804; H01L 2224/8121; B23K 1/0016; B23K 2201/36; B23K 2201/38; B23K 2201/40; B23K 2201/42; H05B 31/0018; H05B 2203/005; H05B 1/005; H05B 1/008; H05B 31/02
USPC ................. 219/391, 647, 653, 774, 775, 79; 392/407, 411, 416, 417, 418; 228/102, 228/103, 179.1, 180.1, 180.21, 180.22, 228/233.2, 8, 9, 43; 432/4, 7, 18, 108, 432/120, 121, 202, 230
See application file for complete search history.

(56) References Cited

U.S. PATENT DOCUMENTS 4,565,917 A * 1/1986 Furtek .................. B23K 1/0053
219/388
4,632,294 A 12/1986 Druschel et al.
(Continued)

*Primary Examiner* — Phuong T Nguyen
(74) *Attorney, Agent, or Firm* — Harrington & Smith

(57) ABSTRACT

Exemplary embodiments of the invention include a method and apparatus for assembling a semiconductor device. The method may include heating the semiconductor device, which comprises a printed circuit card and a packaging laminate, according to a device heating profile to melt solder material located between an array of contact points on the printed circuit card and an array of corresponding contact points on the packaging laminate; and cooling the semiconductor device to solidify the solder material, wherein during at least a portion of the cooling a temperature of the printed circuit card is kept at substantially a same temperature or a higher temperature than a temperature of an electronic module attached to the packaging laminate opposite the corresponding array of contact points.

10 Claims, 9 Drawing Sheets

(51) Int. Cl.
  *B23K 1/008* (2006.01)
  *H01L 23/00* (2006.01)
  *B23K 101/42* (2006.01)

(52) U.S. Cl.
  CPC ............. *H01L 2224/2919* (2013.01); *H01L 2224/32225* (2013.01); *H01L 2224/32245* (2013.01); *H01L 2224/33181* (2013.01); *H01L 2224/73204* (2013.01); *H01L 2224/73253* (2013.01); *H01L 2924/15311* (2013.01); *H01L 2924/15724* (2013.01); *H01L 2924/15738* (2013.01); *H01L 2924/15747* (2013.01); *H01L 2924/163* (2013.01); *H01L 2924/16251* (2013.01); *H05K 2203/1121* (2013.01)

(56) References Cited

U.S. PATENT DOCUMENTS

| | | | |
|---|---|---|---|
| 5,039,841 A * | 8/1991 | Kato | B23K 1/008 219/388 |
| 5,128,506 A * | 7/1992 | Dahne | B23K 1/0053 219/85.13 |
| 5,180,096 A * | 1/1993 | Kondo | B23K 1/008 228/180.1 |
| 5,236,117 A | 8/1993 | Roane et al. | |
| 5,328,087 A * | 7/1994 | Nelson | C09J 9/02 156/273.9 |
| 5,461,766 A * | 10/1995 | Burward-Hoy | B23P 11/025 257/E23.099 |
| 5,647,529 A * | 7/1997 | Liebman | B23K 1/008 228/222 |
| 6,501,051 B1 * | 12/2002 | Richert | H01L 21/67115 219/388 |
| 6,794,616 B1 | 9/2004 | Goenka | |
| 7,156,283 B2 | 1/2007 | Bonet | |
| 8,501,545 B2 | 8/2013 | Grillberger et al. | |
| 2002/0139792 A1 * | 10/2002 | Nobuhara | G01K 7/42 219/494 |
| 2005/0161252 A1 | 7/2005 | Birgel | |
| 2009/0020590 A1 * | 1/2009 | Knickerbocker | B23K 3/0623 228/176 |
| 2011/0073637 A1 | 3/2011 | Vincent et al. | |
| 2012/0052632 A1 * | 3/2012 | Sato | H01L 21/561 438/113 |
| 2014/0256090 A1 * | 9/2014 | Interrante | H01L 24/75 438/121 |
| 2014/0367847 A1 * | 12/2014 | Strader | B23P 15/26 257/717 |

* cited by examiner

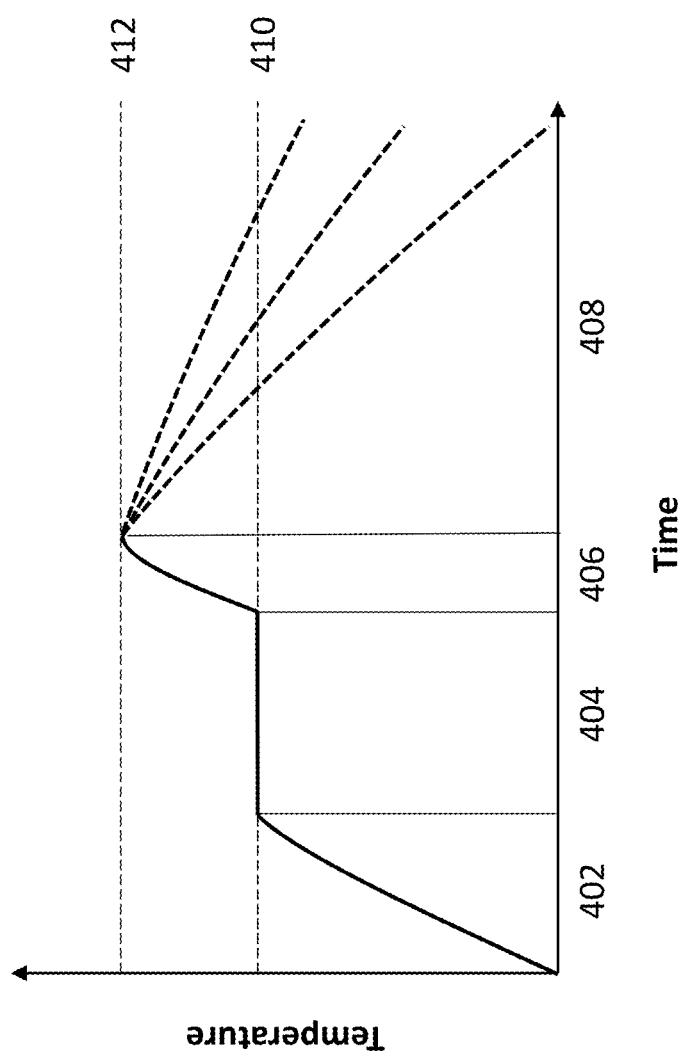

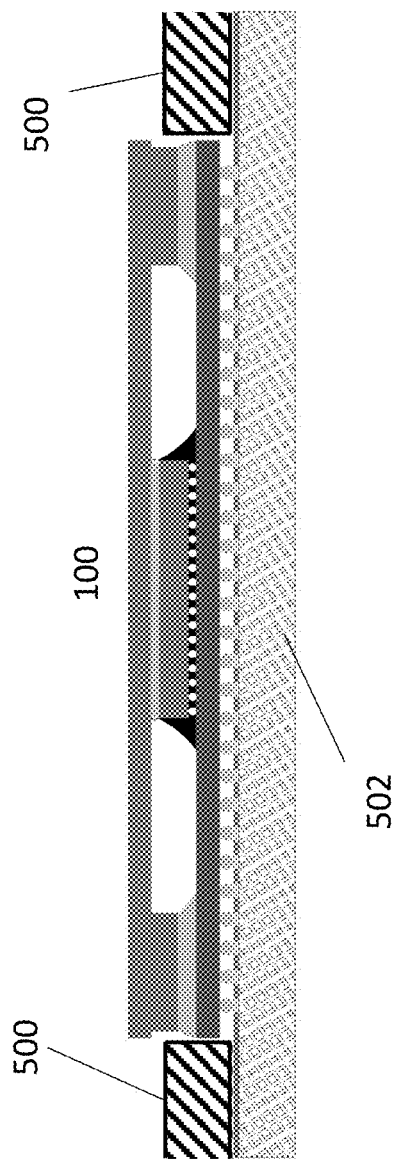
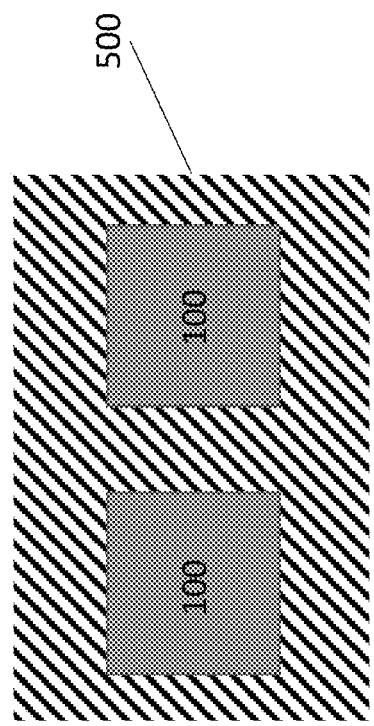
Fig. 5A
Fig. 5B

CIRCUIT CARD ATTACHMENT FOR ENHANCED ROBUSTNESS OF THERMAL PERFORMANCE

TECHNICAL FIELD

This invention relates generally to integrated circuits and, more specifically, relates to the attaching a circuit card, and a package.

BACKGROUND

This section is intended to provide a background or context to the invention disclosed below. The description herein may include concepts that could be pursued, but are not necessarily ones that have been previously conceived, implemented or described. Therefore, unless otherwise explicitly indicated herein, what is described in this section is not prior art to the description in this application and is not admitted to be prior art by inclusion in this section.

A ball grid array (BGA) is a type of packaging that is frequently used for integrated circuits. A BGA package is considered a surface-mount packaging where the electronic module, e.g. a processor, may be attached directly to the surface of a circuit card.

SUMMARY

In one exemplary aspect of the embodiments described herein a method of assembling a semiconductor device is provided, the method comprising: heating the semiconductor device, which comprises a printed circuit card and a packaging laminate, according to a device heating profile to melt solder material located between an array of contact points on the printed circuit card and an array of corresponding contact points on the packaging laminate; and cooling the semiconductor device to solidify the solder material, wherein during at least a portion of the cooling a temperature of the printed circuit card is kept at substantially a same temperature or a higher temperature than a temperature of an electronic module attached to the packaging laminate opposite the corresponding array of contact points.

In one exemplary aspect of the embodiments described herein a reflow oven is provided. The reflow oven comprising: a first set of heaters above a conveyor belt of the reflow oven and a second set of heaters below the conveyor belt; at least one processor; and at least one non-transitory memory including computer program code, the at least one memory and the computer program code are configured to, with the at least one processor, cause the reflow oven to: configure at least one of the first set of heaters and the second set of heaters according to a device heating profile to melt a solder material located between an array of contact points on a printed circuit card of a semiconductor device and a corresponding array of contact points on a packaging laminate of the semiconductor device, wherein the solder material is located between the array of contact points and the corresponding array of contact points; and control a cooling rate of the semiconductor device so that a temperature of the printed circuit card is kept at substantially a same temperature or a higher temperature than a temperature of an electronic module attached to the packaging laminate opposite the corresponding array of contact points.

In one exemplary aspect of the embodiments described herein a semiconductor device is provided assembled according to the method describe above. The semiconductor device comprising a chip connected to the packaging laminate, a thermal interface material, and a heat spreader, the thermal interface material located between a side of the chip opposite the packaging laminate and the heat spreader, and the heating and the cooling may be controlled so as to enhance a compression of the thermal interface material relative to heating and cooling without the control.

BRIEF DESCRIPTION OF THE DRAWINGS

These and other features, aspects, and advantages of the present invention will become better understood with regard to the following description, appended claims, and accompanying drawings, where:

FIG. 4 graphically illustrates a temperature of a reflow process according to exemplary embodiments described herein.

FIG. 5A-5B illustrate coverings placed on a circuit card according to exemplary embodiments described herein.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

In the Summary above and in the Detailed Description and the claims below, and in the accompanying drawings, reference is made to particular features (including method steps) of the invention. It is to be understood that these various features may be combined despite that the description herein does not explore explicitly every single such possible combination. The specific embodiments that are detailed with particularity herein are not a limit to the general teachings herein, and such exemplary embodiment by themselves are not a limit to the scope of the ensuing claims but rather teach the principles of the invention and illuminate the meaning of such ensuing claims.

The exemplary embodiments herein describe techniques for circuit card attachment for enhanced robustness of thermal performance.

Figure 1:
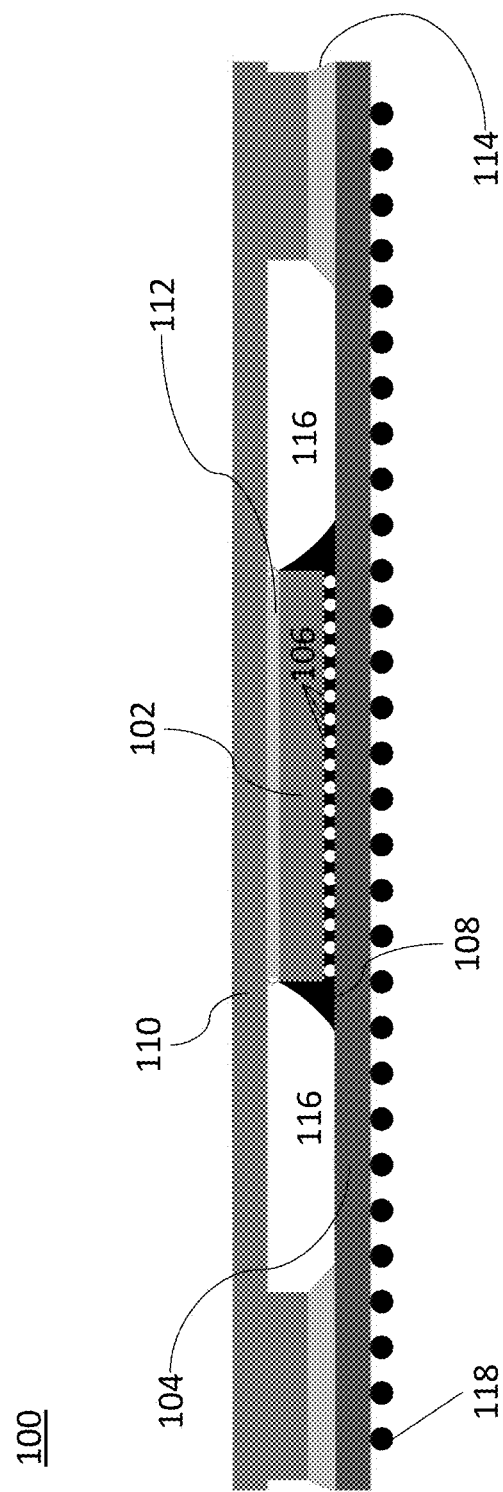
FIG. 1 illustrates a flip chip ball grid array (FCBA) package according to exemplary embodiments described herein.

Referring to FIG. 1, this figure illustrates a certain type of BGA package called a flip chip ball grid array (FCBGA) package 100. In an FCBGA package, a chip 102 is rigidly bonded to the laminate 104 using solder balls 106 and underfill 108, thus creating a bimorph structure that flexes as the temperature changes due to a large mismatch of thermal expansion coefficients between the chip 102 and the laminate 104. When the temperature of the chip 102 rises, heat is transferred from the chip 102 to a heat spreader 110, which is typically copper, but may be any other suitable material, such as aluminum, silver, brass, or bronze. The heat is transferred via a thin thermal interface material (TIM) 112. The TIM 112 may be a variety of different materials, for example: a gel, an adhesive, pad, grease, putty and phase change materials. The periphery of the heat spreader 110 is mechanically attached to the laminate 104 using a band of adhesive referred to as a sealband 114. The sealband 114 is typically silicone, but other adhesives may also be used. An opening 116 may be provided for atmospheric equilibration. The overall structure is mechanically stress free at an elevated temperature of roughly 120° C. to 150° C. which is the temperature range at which the TIM 112, seal band 114 and underfill 108 are typically cured. When cooling to room temperature, the chip 102/laminate 104 bimorph drives the center of the chip 102 into towards the heat spreader 110 thereby creating a compressive stress in the TIM 112 and ensuring excellent thermal transfer. The balls 118 attached underneath the laminate form a Ball Grid Array (BGA). These balls 118 are used to attach the package 100 to a circuit card having a corresponding array of contact points.

Several factors may subsequently affect the compressive stress of the TIM 112, which may cause tension in the TIM 112. For weak gel TIMs in particular, this tension leads to tearing which rapidly degrades thermal transfer performance. The compressive stress in the TIM at room temperature is reduced when the temperature of the package is increased so that the package is closer to its stress free state. Therefore, as the chip 102 heats to the operating temperature, compression is reduced.

Another factor that affects compressive stress is exposure to high humidity. Exposing the package to high humidity is often unavoidable and an important component of stress testing. Moisture absorption causes the laminate 104 to swell which tends to pull the chip 102 away from the heat spreader 110, thereby reducing TIM 112 compression. Measurements show that, when saturated, this swelling reduces the compression by an amount equivalent to a rise in temperature of 40° C. Therefore, at an operating temperature of 85° C. such a saturated package will behave like a dry package at 125° C., which is dangerously close to the stress free temperature.

If these, or other, factors lower the compression enough, the TIM 112 will go into tension at the operating temperature which results in poor thermal performance. Therefore, there is a need to provide additional compressive stress to the TIM 112 to ensure reliable thermal performance and to avoid further tensile stress contributions.

Figure 2:
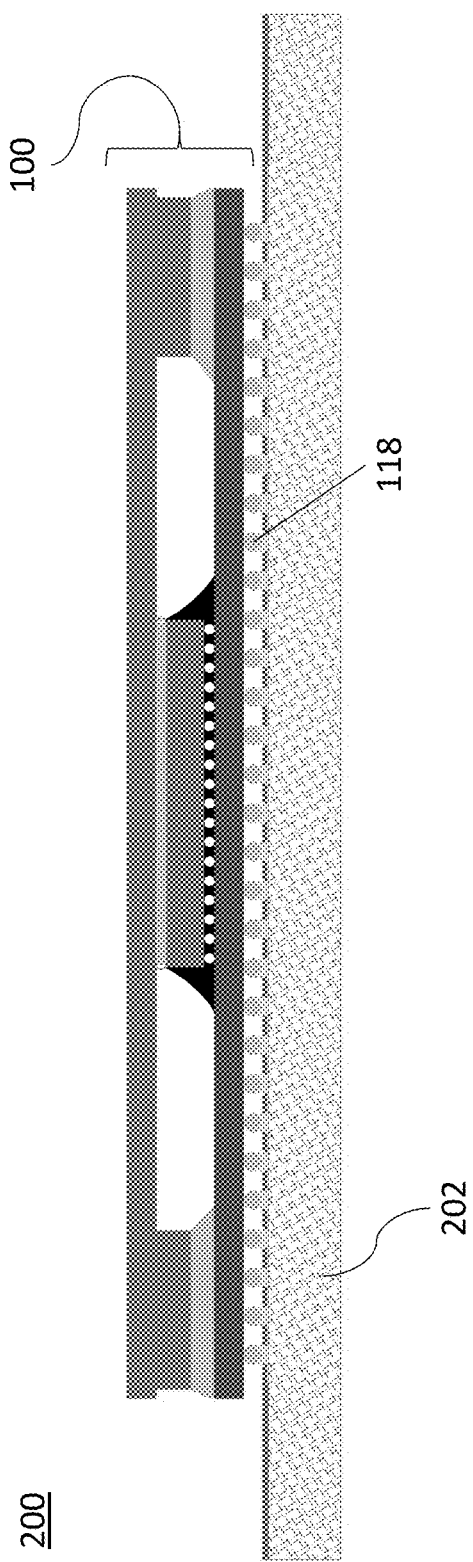
FIG. 2 illustrates a FCBA package that is attached to a circuit card according to exemplary embodiments described herein.

FIG. 2 illustrates the package 100 from FIG. 1, attached to a printed circuit card 202. The package/printed circuit card is referred to herein as a semiconductor device 200. Each of the balls 118 from FIG. 1 may be coated with solder material and may be placed on a corresponding array of contact points on the printed circuit card 202. It is noted that in FIG. 2 that each ball 118 and corresponding contact point on the circuit card are shown together. Typically, a reflow oven is used to heat the semiconductor device 200 and melt the solder material between the laminate 104 and the circuit card 202. The semiconductor device is then cooled to solidify the solder material and create a permanent joint between the laminate 104 and the circuit card 202. The assembled semiconductor device may then be used in a wide variety of electronic products.

Figure 3:
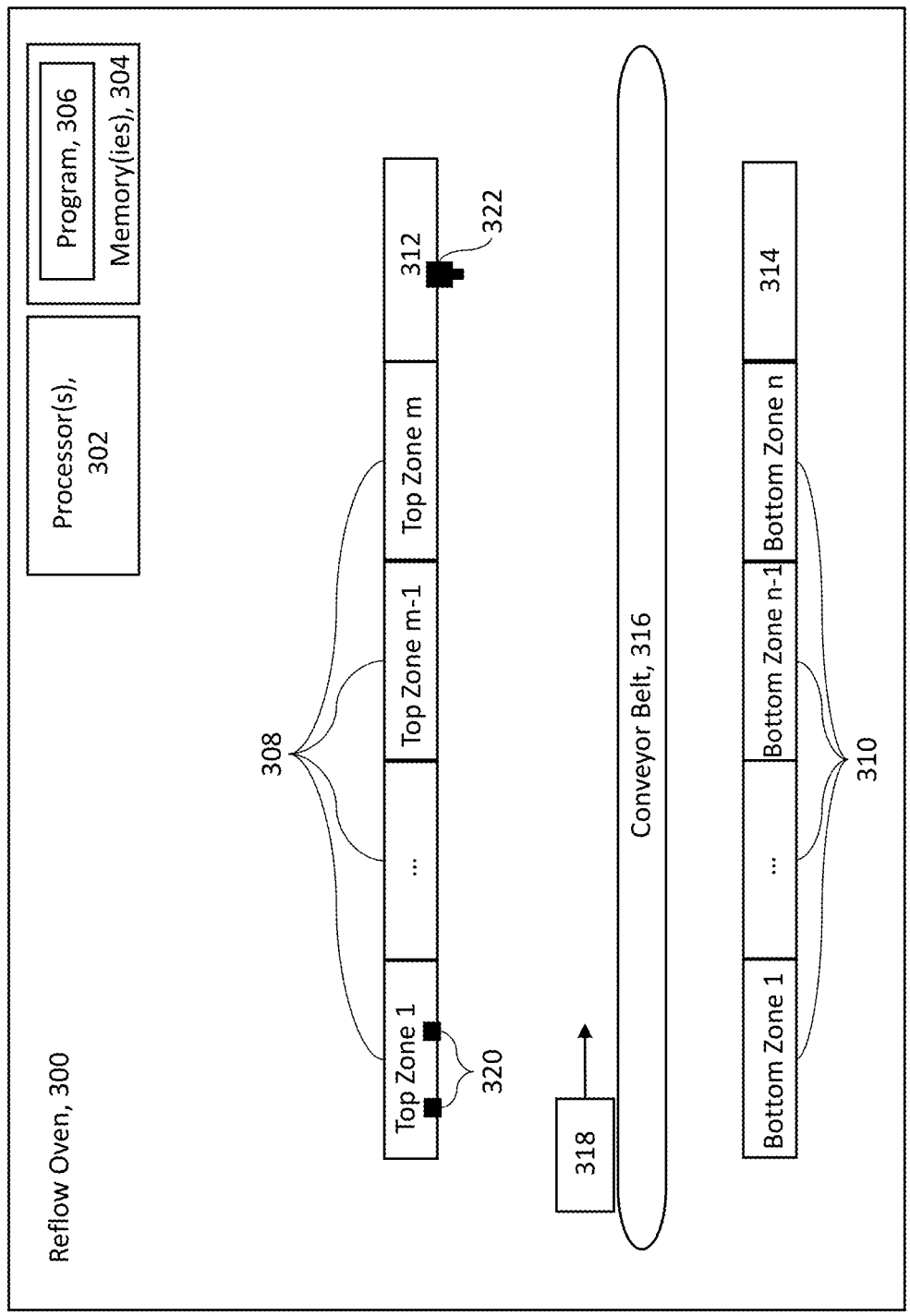
FIG. 3 illustrates a reflow oven according to exemplary embodiments described herein.

Referring now to FIG. 3, this figure illustrates a reflow oven 300 according to exemplary embodiments. The reflow oven 300 may comprise at least one processor 302 and at least one non-transitory memory 304 storing computer program code 306. Although the processor(s) 302 and memory (ies) 304 are depicted in FIG. 3 as part of the reflow oven 300; it should be understood that the reflow oven may also be programmed using a device comprising the processor(s) 302 and memory(ies) 304) which is connectable to the reflow oven having processor(s) 302 and memory(ies) 304. The reflow oven 300, may also include any number of zones of heaters 308, 310, where each zone has at least one heater configurable by the processor(s) 302 and memory(ies) 304 storing computer program code. In FIG. 3, for example, there is a set of top zones 308 above a conveyor belt 316 and a set of bottom zones 310 below the conveyor belt 316. The conveyor belt 316 may carry the semiconductor device 318 in the direction indicated by the arrow. The speed of the conveyor belt 316 may also be configurable by the by the processor(s) 302 and memory(ies) 304 storing computer program code. Following the last top zone 308 and last bottom zone 310 in the reflow oven 300 depicted in FIG. 3 are cooling zones 312, 314. The top cooling zone 312 may optionally have a cooling nozzle 322, which may direct airflow towards the semiconductor device 318 as the semiconductor device 318 is moved under the cooling nozzle 322 by the conveyor belt 316. The cooling nozzle 322 may, for example, direct room temperature nitrogen towards the semiconductor device 318. The cooling nozzle may be a single stainless steel tube that is 3-12 mm in diameter that delivers room temperature nitrogen at a flow rate in the range of 0.1 to 1.0 SLM (standard liters per minute). The distance of the cooling nozzle to the heat spreader of the semiconductor device should be positioned to minimize preheating the flow nitrogen before it impinges on the heat spreader surface. For example, a distance of less than 50 mm is very effective while a distance of more than 250 mm is much less effective. Heat transfer calculations can be used to design the cooling process which is a function of the heat spreader material and mass, the conveyor belt speed, the nozzle distance and nitrogen flow rate. The objective is to enhance the cooling of the semiconductor device so that it is cooling down as fast as the background circuit card or faster.

Referring now to FIG. 4, this figure shows a temperature graph corresponding to a heating profile for a reflow process to assemble a semiconductor device in a reflow oven (e.g. the reflow oven 300 in FIG. 3). An initial heating region 402 heats the temperature of the reflow oven to plateau heating temperature 410. The plateau heating temperature 410 may be below 180° C., for example about 10 to 15° C. below the melting temperature of the solder. A plateau heating temperature 410 more than 20° C. below the melting temperature of the solder may be less effective. The plateau heating temperature 410 is maintained over the plateau heating region 404 to promote uniform heating of the semiconductor device. The reflow oven is then heated to a peak reflow temperature 412 over region 406. Cooling of the semiconductor device occurs over cooling region 408. During the time period when the temperature is between the plateau heating temperature 410 and the peak reflow temperature 412 a solder material of the semiconductor device is fully melted, and then solidified during the cooling region 408. The dashed lines over the cooling region 408 represent various different cooling rates. Very fast cooling rates (e.g. >50° C. /min), as are typically practiced, result in large temperature gradients (e.g. >60° C.) between components and printed circuit card. Upon heating from room temperature, the TIM state changes from compression to tension at temperatures that are below the normal system operating temperatures (e.g. <60° C.).

When semiconductor devices undergo the reflow process described above, the typical heating response for card assemblies is that the printed circuit card responds sooner to the heater temperature than do the electronic modules that are placed on the circuit card. During heating, the circuit card temperature is higher than the electronic module temperature and similarly, during cooling the circuit card temperature drops much quicker than the electronic module temperature. So far, manufacturers have not been concerned with how the semiconductor device is cooled; but instead, simply ensure that all solder balls fully melt and make reliable electrical connections between an electronic module and a printed circuit card during the reflow process.

Embodiments describes herein are directed to techniques of controlling the temperatures of a printed circuit card and a package during the cooling process (e.g. over the cooling region 408 in FIG. 4) so that the printed circuit card is kept at substantially the same temperature or a higher temperature than the temperature of the packaging laminate.

Embodiments of the invention control at least a portion of the cooling process in such a way that affects the compressive state of the TIM. The portion may be less than or all of the cooling process. For example, cooling portions may include when the temperature is above the solder melting point, at the solder melting point and below the solder melting point when solder solidification occurs. At very slow cooling rates, nearly isothermal cooling occurs across the circuit card assembly. Consequently, the temperature at which the TIM changes from compression to tension increases to above normal system operating temperatures (>85° C.). Reflow profiles have been created that result in a cooling rate of 115° C./min which creates a temperature gradient between the electronic module and printed circuit card of 65° C. The result is that at room temperature, the TIM is in a tensile state and will exhibit poor thermal performance at normal operating temperatures. A reflow profile that resulted in very slow, isothermal cooling of 1° C./min yielded a TIM compressive state that was stable to >100° C.

Solidification occurs over a narrow temperature range depending on purity and contaminant level. According to one embodiment, the portion of the cooling process may refer to portion below the solder melting point when solder solidification occurs. This portion of the cooling process is when the thermal mechanical effect of a temperature gradient between the semiconductor device and the circuit card is locked in. So, if the semiconductor device and circuit card are the same temperature, since each has a coefficient of thermal expansion that is approximately the same, the contraction on cooling to room temperature will be the same over the area of the solder ball grid array. Solder solidification typically would occur just below the melting point; however, the solder can still remain soft just below the melting point, so it is important to maintain the isothermal cooling for temperatures below the solder melting point, for example at least 10° C. below the solder melting point. After reaching 10° C. below the melting point, it is less important that isothermal cooling be maintained. Certain embodiments of the invention allow for reflow profiles that achieve temperature uniformity within 5° C. between a critical solidification temperature range of 220-230° C. This has resulted in a 30° C. increase in temperature at which the TIM transitions from compression to tension.

FIGS. 5-8 illustrate various techniques which may be applied to make the temperature gradient between the electronic module and printed circuit card during cooling more uniform.

Referring to FIG. 5A, this figure illustrates a cross-sectional view of heat resistant coverings 500 which may be placed on or in close proximity to a circuit card 502. A variety of different configurations may be made using the coverings 500. FIG. 5A shows coverings 500 placed on the circuit card 502 which surround the FCBGA package 100. In this example, the coverings 500 are shown separately, but one or more coverings 500 may be used depending on the layout of the package and other components which may be located on the circuit card 500.

FIG. 5B shows another example view of the coverings 500 from a bird's eye view. The example in FIG. 5B has two packages 100 on the same circuit card (not shown) with the coverings 500 placed on the circuit card in such a way as to cover the area surrounding each package 100. In the example shown in FIG. 5B, a single covering 500 with cutouts for each package 100 may be used, or multiple coverings 500 may be used to cover the area. The covering 500 may be a glass fiber cloth with cutouts where the package is located. The coverings 500 allow the circuit card 502 to retain the heat applied during the reflow process for a longer period of time, thus allowing the circuit card 502 to cool at rate that is closer to the cooling rate of the package(s) 100. The coverings 500 may be made of any suitable heat resistant material for allowing the circuit card and the package to cool isothermally, for example, high temperature polymers some examples of which include Kapton, Teflon, Nomex and Kevlar.

Figure 6:
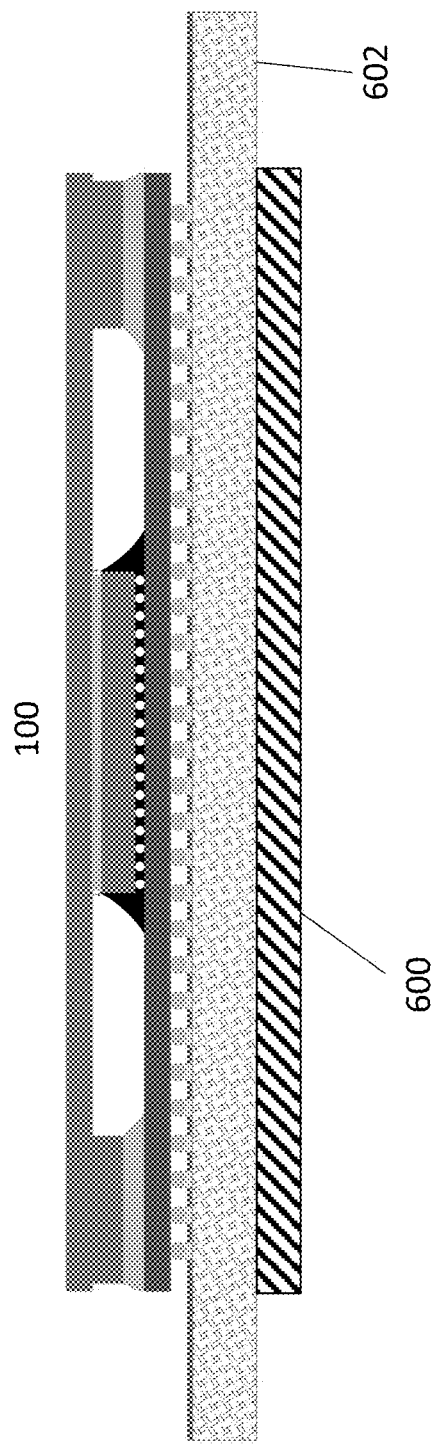
FIG. 6 illustrates a FCBA package connected to a circuit card placed on top of a material according to exemplary embodiments described herein.

FIG. 6, shows another example embodiment where a plate 600 is placed on an opposite side of the circuit card 602 (e.g. underneath the circuit card) to where the package 100 is to be attached. Similar to the covering 500 of FIG. 5, the plate 600 may be used to control the rate of cooling of the circuit card 602 to be closer to that of package 100. The plate 600 may be copper, or any other suitable material, such as aluminum, stainless steel, ceramics such as alumina, aluminum nitride, or glass or quartz.

Figure 7:
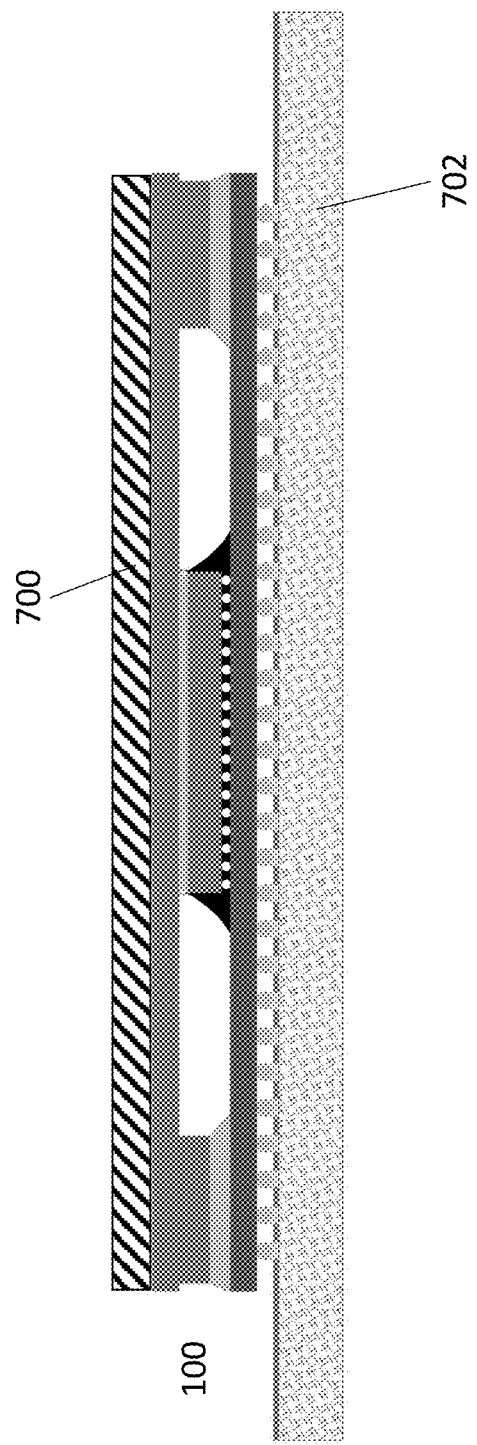
FIG. 7 illustrates a thermal conductive material placed on top of an electronic module according to exemplary embodiments described herein.

FIG. 7 shows another example embodiment which uses a package covering 700. The example shown in FIG. 7 shows a package covering 700 which is placed on top of a package 100. The package covering 700 may be any suitable thermally conductive material which results in a faster cooling rate for the package 100, for example a heatsink. The package covering 700 may be a flat piece of material placed on top of the package 100. Alternatively, the package covering 700 may have a foot along the entire edge of the covering such that the package covering 700 rests on the circuit card 702 so as to fully enclose the package 100. Or, the package covering 700 may have one or more legs which rest on the circuit card 702 so that the package covering is placed closely above the package 100. The package covering 700 may have a dimpled or porous surface to allow the package covering 702 to cool more quickly when exposed to air. The package covering may comprise any suitable thermal conductive material, such as copper, aluminum, stainless steel, ceramics such as alumina, aluminum nitride.

It should be noted that the example embodiments of FIGS. 5-7 may be used alone or in any combination with each other. It is also noted that FIGS. 5-7 generally show the coverings 500, 700 and the plate 600 positioned in areas which closely correspond to the boundaries of the package 100, however this need not be the case. For example: the coverings 500 may be separated from the package 100 by some space; the area of the plate 600 may be larger or smaller than the area of the package 100; and the package covering 700 may be larger or smaller than the area of the package 100.

Figure 8:
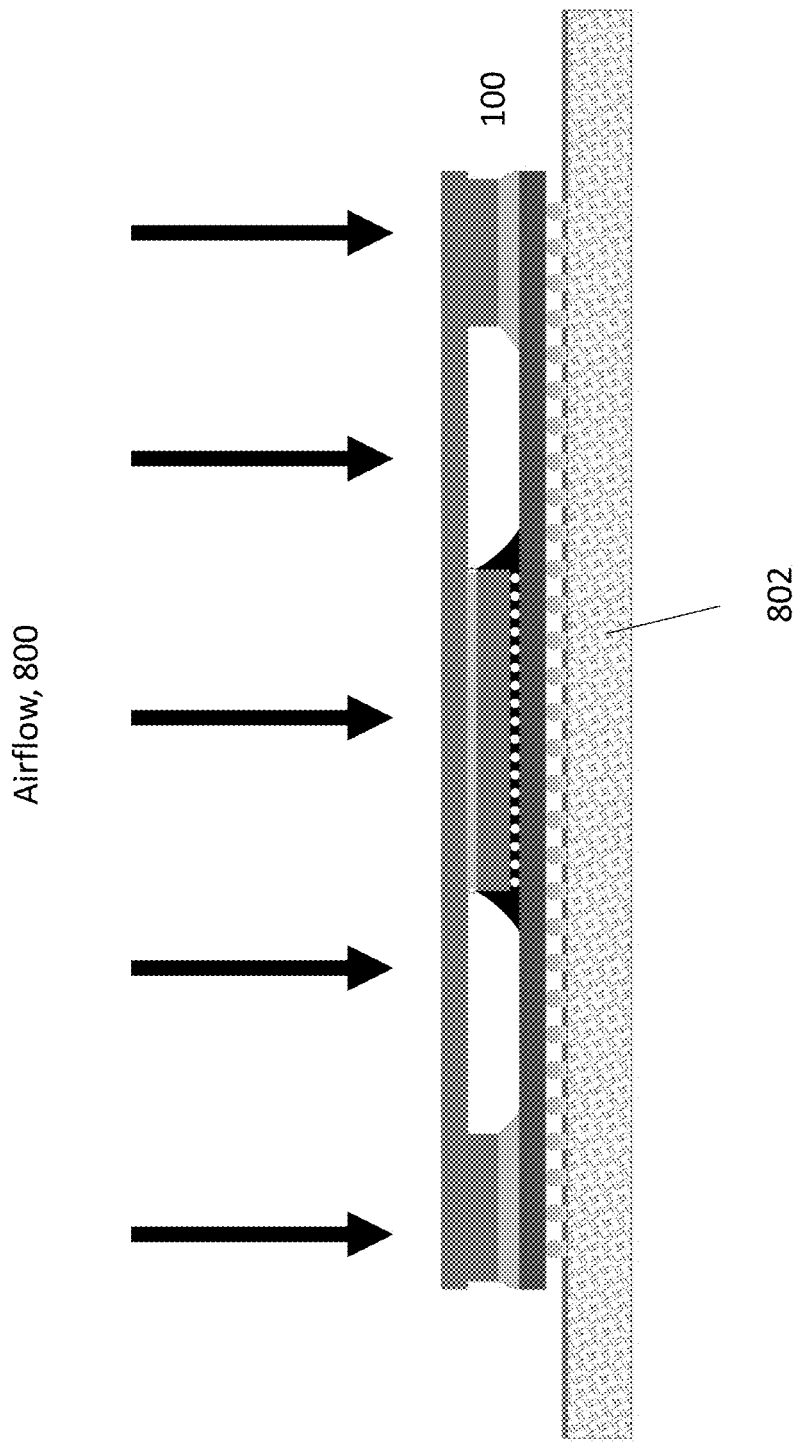
FIG. 8 illustrates airflow directed onto an electronic module according to exemplary embodiments described herein.

FIG. 8 shows an example embodiment which uses airflow 800 to control the cooling of a semiconductor device. In FIG. 8, airflow is directed to the top of the package 100. One possible way the airflow may be applied is by using the cooling nozzle 322 of FIG. 3. By directing the airflow 800 to the top of the package 100 the cooling rate of the package 100 may be increased to more closely align with the cooling rate of the circuit card 802.

Controlling the cooling process adds an important mechanical member to the overall structure and can significantly influence the final compressive stress in the thermal interface material. Furthermore, conditions are described in which gradients of a particular sign are deliberately created so as to increase the compression beyond its original value.

Figure 9:
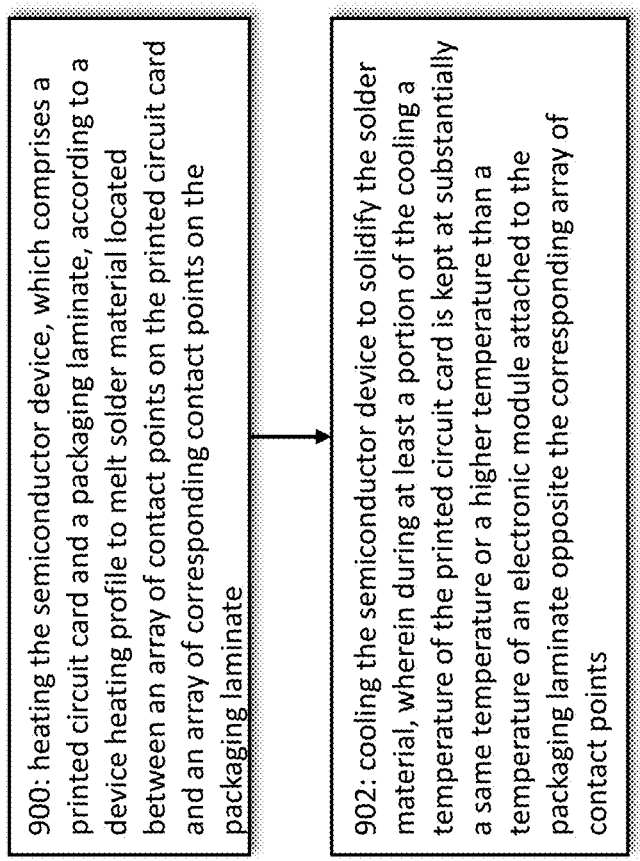
FIG. 9 is a logic flow diagram for circuit card attachment for enhanced robustness of thermal performance, and illustrates the operation of an exemplary method, a result of execution of computer program instructions embodied on a computer readable memory, functions performed by logic implemented in hardware, and/or interconnected means for performing functions in accordance with exemplary embodiments.

FIG. 9 illustrates is a logic flow diagram for circuit card attachment for enhanced robustness of thermal performance, and illustrates the operation of an exemplary method, a result of execution of computer program instructions embodied on a computer readable memory, functions performed by logic implemented in hardware, and/or interconnected means for performing functions in accordance with exemplary embodiments. It assumed that a reflow oven, e.g. 300 of FIG. 3, perform the blocks in FIG. 9, but the blocks may also be performed by an external computer capable of controlling the reflow oven.

Referring to FIG. 9, an example method of assembling a semiconductor device may comprise: heating the semiconductor device, which comprises a printed circuit card and a packaging laminate, according to a device heating profile to melt solder material located between an array of contact points on the printed circuit card and an array of corresponding contact points on the packaging laminate as indicated by block 900; and cooling the semiconductor device to solidify the solder material, wherein during at least a portion of the cooling a temperature of the printed circuit card is kept at substantially a same temperature or a higher temperature than a temperature of an electronic module attached to the packaging laminate opposite the corresponding array of contact points as indicated by block 902.

The semiconductor device may comprise a chip connected to the packaging laminate, a thermal interface material, and a heat spreader, the thermal interface material located between a side of the chip opposite the packaging laminate and the heat spreader, and the heating and the cooling may be controlled so as to enhance a compression of the thermal interface material relative to heating and cooling without the control. Heating the semiconductor device may comprise heating the semiconductor device in a reflow oven having a first set of heaters above the semiconductor device and a second set of heaters below the semiconductor device, wherein at least one of the first set of heaters and the second set of heaters may be individually adjusted to apply a higher temperature on a side of the printed circuit card opposite the electronic module. The device heating profile may comprise a plateau heating region, a peak temperature, and a reflow region, and the higher temperature may be applied during the reflow region of the device heating profile. The cooling may comprise placing heat resistant coverings in contact with the printed circuit card or in close proximity to the printed circuit card to slow the rate of cooling of the printed circuit card in regions of the printed circuit card where cooling to solidification is occurring. The heat resistant coverings may provide insulation against a cooling effect of air surrounding the printed circuit card. The heat resistant coverings may provide increased thermal mass to slow the cooling of the printed circuit card. The cooling may comprise increasing the cooling rate of the electronic module by providing air flow onto the electronic module. The cooling may comprise increasing the cooling rate of the electronic module by transferring heat away from the electronic module by placing at least one object in close proximity to the electronic module. The method may further comprise directing air flow onto the at least one object, wherein the at least one object is a heat sink. The cooling the semiconductor device to solidify the solder material may comprise adjusting a conveyor belt speed of a reflow oven so that a temperature of the printed circuit card is kept at substantially a same temperature or a higher temperature than a temperature of an electronic module attached to the packaging laminate.

An example embodiment may be provided in a reflow oven, for example the reflow oven 300 of FIG. 3. The reflow over may comprise: a first set of heaters above a conveyor belt of the reflow oven and a second set of heaters below the conveyor belt; at least one processor; and at least one non-transitory memory including computer program code, the at least one memory and the computer program code may be configured to, with the at least one processor, cause the reflow oven to: configure at least one of the first set of heaters and the second set of heaters according to a device heating profile to melt a solder material located between an array of contact points on a printed circuit card of a semiconductor device and a corresponding array of contact points on a packaging laminate of the semiconductor device, wherein the solder material is located between the array of contact points and the corresponding array of contact points; and control a cooling rate of the semiconductor device so that a temperature of the printed circuit card is kept at substantially a same temperature or a higher temperature than a temperature of an electronic module attached to the packaging laminate opposite the corresponding array of contact points.

The configuring may comprise adjusting at least one heater of the first set heaters and/or the second set of heaters to apply a higher temperature on a side of the printed circuit card opposite the electronic module. The device heating profile may comprise a plateau heating region, a peak temperature, and a reflow region, and the higher temperature may be applied during the reflow region of the device heating profile. The at least one memory and the computer program code may be configured to, with the at least one processor, cause the reflow oven to: adjust a speed of the conveyor belt to control the cooling rate of the semiconductor device. Adjusting the speed of the conveyor belt may comprise reducing the speed of the conveyor belt in at least one portion of the reflow oven after the solder material is melted. The reflow oven may comprise at least one cooling nozzle located above the conveyor belt and following the first set of heaters. The at least one memory and the computer program code may be configured to, with the at least one processor, cause the reflow oven to perform at least one of: configure the at least one cooling nozzle to provide air flow onto the electronic module to control the cooling rate in regions of the printed circuit card where cooling to solidification is occurring; configure the at least one cooling nozzle to provide air flow onto at least one object placed on top of the electronic module, wherein the at least one object may be a heatsink which increases the cooling rate of the electronic module by transferring heat away from the electronic module. The at least one memory and the computer program code may be configured to, with the at least one processor to control the cooling rate of the semiconductor device so as to enhance the compression of a thermal interface material of the semiconductor device.

Another example embodiment may be provided in a semiconductor device assembled according to the example method described above. The semiconductor device may comprise a chip connected to the packaging laminate, a thermal interface material, and a heat spreader, the thermal interface material located between a side of the chip opposite the packaging laminate and the heat spreader, and the heating and the cooling may be controlled so as to enhance a compression of the thermal interface material relative to heating and cooling without the control.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It is also noted herein that while the above describes example embodiments of the invention, these descriptions should not be viewed in a limiting sense. Rather, there are several variations and modifications which may be made without departing from the scope of the present invention.

If desired, the different functions discussed herein may be performed in a different order and/or concurrently with each other. Furthermore, if desired, one or more of the above-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of assembling a semiconductor device, wherein the semiconductor device comprises a semiconductor package and a printed circuit card, and wherein the method comprises:
    placing the semiconductor package on the printed circuit card;
    heating the semiconductor package and the printed circuit card in a reflow oven according to a device heating profile to melt solder material located between an array of contact points on the printed circuit card and an array of corresponding contact points on a packaging laminate of the semiconductor package;
    placing heat resistant coverings in contact with the printed circuit card or in close proximity to the printed circuit card such that the printed circuit card is exposed through the heat resistant coverings;
    cooling the semiconductor device to solidify the solder material, wherein during at least a portion of the cooling a temperature of the printed circuit card is kept at substantially a same temperature or a higher temperature than a temperature of the semiconductor package;
    controlling the cooling of the semiconductor device by maintaining an isothermal cooling from a peak reflow temperature of the solder material to at least ten Centigrade degrees below a melt point of the solder material such that the semiconductor device cools at least as fast as the printed circuit card, wherein cooling the semiconductor device is at a rate that maintains a thermal interface material in a compressive state;
    wherein the heat resistant coverings are placed to slow the rate of the cooling of the printed circuit card and to retain heat in regions of the printed circuit card where cooling to solidification is occurring, and
    wherein the heat resistant coverings provide insulation against a cooling effect of air surrounding the printed circuit card.

2. The method of claim 1, wherein the semiconductor package comprises a chip connected to the packaging laminate, the thermal interface material, and a heat spreader, the thermal interface material located between a side of the chip opposite the packaging laminate and the heat spreader, and
    wherein the heating and the cooling are controlled so as to enhance the compressive state of the thermal interface material relative to heating and cooling without the control.

3. The method of claim 1, wherein the reflow oven comprises a first set of heaters above the semiconductor device and a second set of heaters below the semiconductor device, wherein the method comprises individually adjusting at least one of the first set of heaters and the second set of heaters to apply a higher temperature on a side of the printed circuit card opposite the semiconductor package.

4. The method of claim 3, wherein the device heating profile comprises a plateau heating region, a peak temperature, and a reflow region, and wherein the higher temperature is applied during the reflow region of the device heating profile.

5. The method of claim 1, wherein the heat resistant coverings provide increased thermal mass to slow the rate of the cooling of the printed circuit card.

6. The method according to claim 1, comprising increasing a rate of the cooling of the semiconductor package by directing air flow to at least a part of the semiconductor package.

7. The method according to claim 1, wherein the method comprises increasing a rate of the cooling of the semiconductor package by transferring heat away from the semiconductor package by placing at least one object in close proximity to the semiconductor package.

8. The method of claim 7, further comprising directing air flow onto the at least one object, wherein the at least one object is a heat sink.

9. The method of claim 1, wherein cooling the semiconductor device to solidify the solder material comprises adjusting a conveyor belt speed of the reflow oven so that the temperature of the printed circuit card is kept at a same temperature or a higher temperature than the temperature of the semiconductor package.

10. A semiconductor device comprising: a semiconductor package comprising:
    a packaging laminate, a chip connected to the packaging laminate, a thermal interface material, and a heat spreader, the thermal interface material located between a side of the chip opposite the packaging laminate and the heat spreader;
    a printed circuit card, wherein the semiconductor device is assembled by a method comprising:

placing the semiconductor package on the printed circuit card;

heating the semiconductor package and the printed circuit card in a reflow oven according to a device heating profile to melt solder material located between an array of contact points on the printed circuit card and an array of corresponding contact points on the packaging laminate of the semiconductor package;

placing heat resistant coverings in contact with the printed circuit card or in close proximity to the printed circuit card such that the printed circuit card is exposed through the heat resistant coverings;

cooling the semiconductor device to solidify the solder material, wherein during at least a portion of the cooling a temperature of the printed circuit card is kept at a same temperature or a higher temperature than a temperature of the semiconductor package; and controlling the cooling of the semiconductor device by maintaining an isothermal cooling from a peak reflow temperature of the solder material to at least ten Centigrade degrees below a melt point of the solder material such that the semiconductor device cools at least as fast as the printed circuit card, wherein cooling the semiconductor device is at a rate that maintains the thermal interface material in a compressive state;

wherein the heat resistant coverings are placed to slow the rate of the cooling of the printed circuit card and to retain heat in regions of the printed circuit card where cooling to solidification is occurring, and wherein the heat resistant coverings provide insulation against a cooling effect of air surrounding the printed circuit card.

* * * * *